(12) United States Patent
Berthold et al.

(10) Patent No.: US 6,717,503 B2
(45) Date of Patent: Apr. 6, 2004

(54) COIL AND COIL SYSTEM FOR INTEGRATION INTO A MICROELECTRONIC CIRCUIT AND MICROELECTRONIC CIRCUIT

(75) Inventors: Jörg Berthold, München (DE); Dieter Sewald, Bruckmühl (DE); Marc Tiebout, Müchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/200,422

(22) Filed: Jul. 22, 2002

(65) Prior Publication Data

US 2003/0034867 A1 Feb. 20, 2003

Related U.S. Application Data

(63) Continuation of application No. PCT/EP01/00584, filed on Jan. 19, 2001.

(30) Foreign Application Priority Data

Jan. 20, 2000 (DE) .......................................... 100 02 377

(51) Int. Cl.⁷ ................................................. H01F 5/00
(52) U.S. Cl. ........................ 336/200; 336/223; 336/232
(58) Field of Search ................................ 336/200, 223, 336/232

(56) References Cited

U.S. PATENT DOCUMENTS

| | | | |
|---|---|---|---|
| 3,614,554 A | | 10/1971 | Shield et al. |
| 5,055,816 A | * | 10/1991 | Altman et al. ............... 336/200 |
| 5,658,423 A | | 8/1997 | Angell et al. |
| 5,728,253 A | | 3/1998 | Saito et al. |
| 5,864,773 A | | 1/1999 | Barna et al. |
| 5,877,032 A | | 3/1999 | Guinn et al. |
| 5,884,990 A | | 3/1999 | Burghartz et al. |
| 6,008,102 A | | 12/1999 | Alford et al. |
| 6,188,306 B1 | * | 2/2001 | Wollesen ..................... 336/200 |
| 6,218,925 B1 | * | 4/2001 | Iwao ........................... 336/200 |
| 6,411,086 B1 | * | 6/2002 | Choi et al. ................... 324/253 |
| 6,429,764 B1 | * | 8/2002 | Karam et al. ............... 336/200 |
| 6,456,183 B1 | * | 9/2002 | Basteres et al. ............ 336/200 |

FOREIGN PATENT DOCUMENTS

| | | |
|---|---|---|
| EP | 0 512 718 A1 | 11/1992 |
| EP | 0 555 994 A1 | 8/1993 |
| EP | 0 602 855 A1 | 6/1994 |
| EP | 0 725 407 A1 | 8/1996 |
| EP | 0 834 922 A2 | 4/1998 |
| WO | WO 98/50956 | 11/1998 |
| WO | WO 99/21210 | 4/1999 |

OTHER PUBLICATIONS

Alexander E. Braun: "Copper Electroplating Enters Mainstream Processing", *Semiconductor International*, Apr. 1999, vol. 22, No. 4, pp. 58–60, 62, 64, and 66.

* cited by examiner

*Primary Examiner*—Anh T. Mai
(74) *Attorney, Agent, or Firm*—Laurence A. Greenberg; Werner H. Stemer; Gregory L. Mayback

(57) ABSTRACT

The coil and coil system is provided for integration in a microelecronic circuit. The coil is placed inside an oxide layer of a chip, and the oxide layer is placed on the substrate surface of a substrate. The coil comprises one or more windings, whereby the winding(s) is/are formed by at least segments of two conductor tracks, which are each provided in spatially spaced-apart metalization levels, and by via-contacts which connect these conductor track(s) and/or conductor track segments. In order to be able to produce high-quality coils, a coil is produced with the largest possible coil cross-section, whereby a standard metalization, especially a standard metalization using copper, can, however, be used for producing the oil. To this end, the via contacts are formed from a stack of two ore more via elements arranged one above the other. Parts of the metalization levels can be located between the via elements.

30 Claims, 8 Drawing Sheets

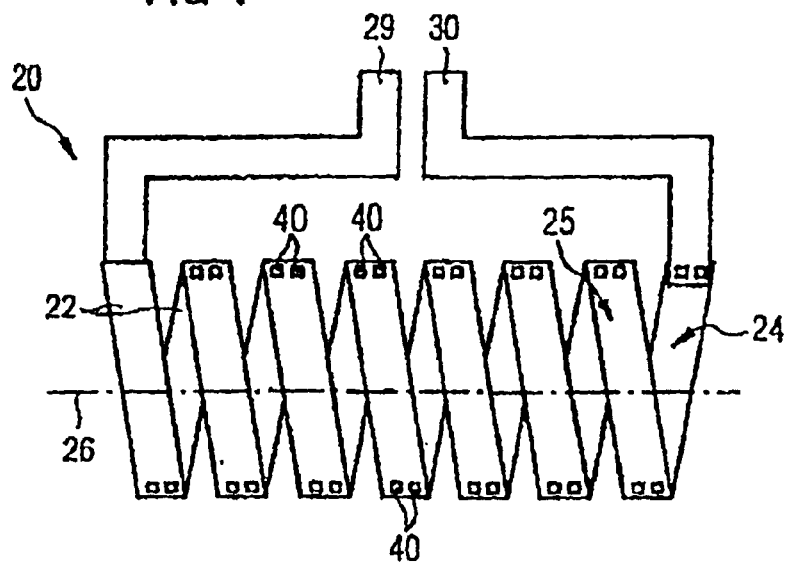
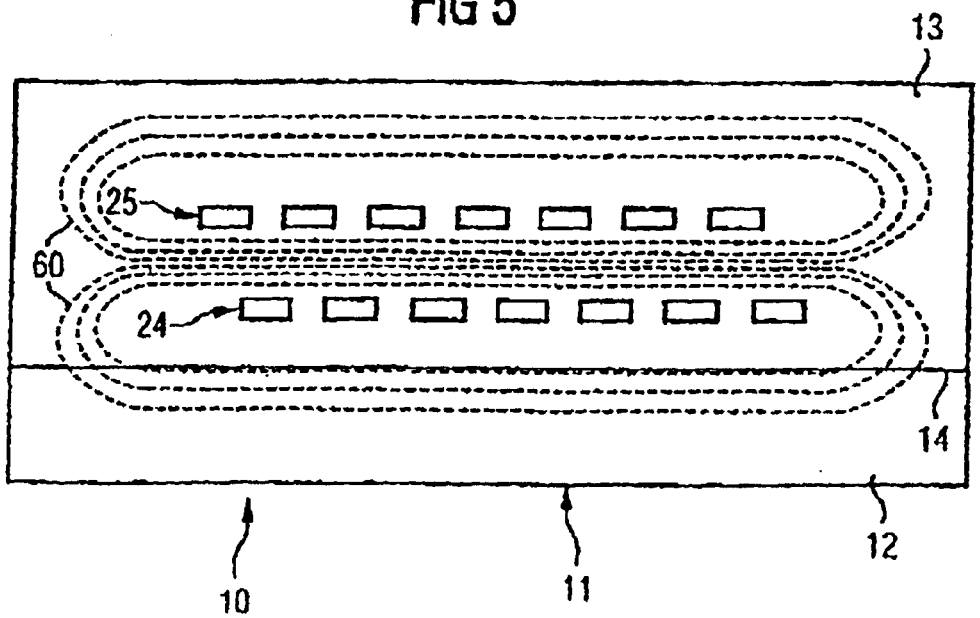

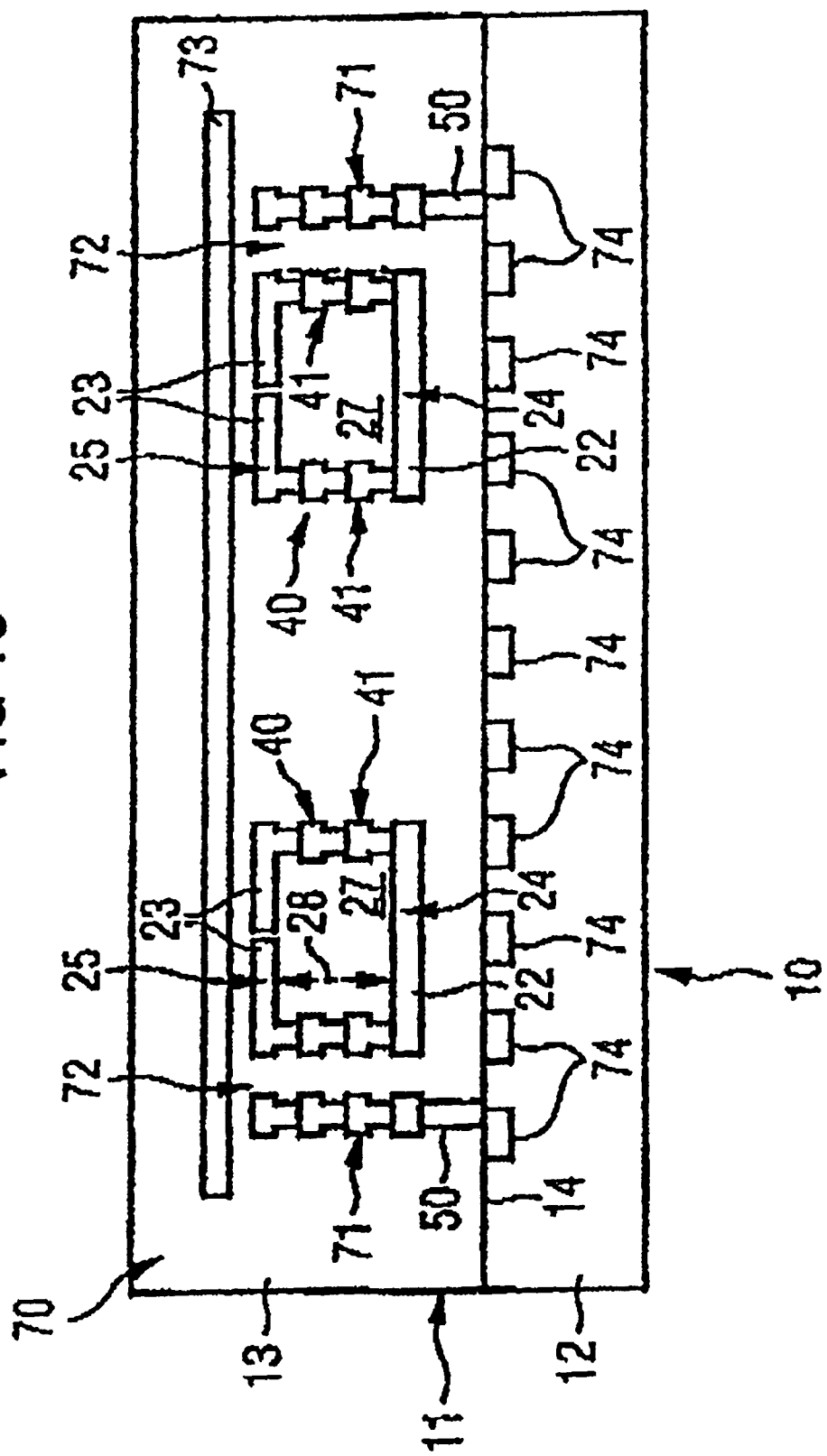

COIL AND COIL SYSTEM FOR INTEGRATION INTO A MICROELECTRONIC CIRCUIT AND MICROELECTRONIC CIRCUIT

CROSS-REFERENCE TO RELATED APPLICATION

This application is a continuation of copending International Application No. PCT/EP01/00584, filed Jan. 19, 2001, which designated the United States and was not published in English.

BACKGROUND OF THE INVENTION

Field of the Invention

The present invention relates to a coil and to a coil system for integration into a microelectronic circuit. Furthermore, the invention relates to a microelectronic circuit.

Inductances (coils) are required in a multitude of circuit types, for example in oscillators, amplifiers, mixers or the like. The inductances, i.e., inductors, belong to the component types whose integration on a chip together with the remaining circuit parts can give rise to problems. To date this has meant that inductances are in many cases still used as discrete components, since they would otherwise have disadvantages as coil forms integrated on chips. At very high frequencies, that is to say at frequencies in ranges far above 1 GHz, integrated inductances have to be used in any case since signal transmission then becomes very difficult via the leads of the discrete coils.

FIG. 1 illustrates a typical coil implementation as it is known from the prior art. A metal track runs through a spiral, thereby producing a number of turns with increasing radii. If a plurality of metal layers are available on the chip, such spirals can be stacked. The inductances add up through connection in series. Track resistances are reduced in the event of connection in parallel, which leads to lower power losses. However, these known coils, or coil forms, have a series of disadvantages. A particular disadvantage results, for example, from the punch-through of the magnetic field into the substrate, usually a silicon substrate. Generally, in modern CMOS technologies, a relatively low-impedance substrate is used, which results in a relative high induced current caused by the alternating magnetic fields. This leads to relatively high losses, which means that the quality factor of the integrated inductance (coil) is relatively low. In the gigahertz frequency range, the quality factor is, for example, orders of magnitude lower compared with discrete coils. Since the coil quality factor is an important performance variable of analog circuits, there is a need to improve the quality factor of the coils.

The coil types described above are used in standard CMOS processes, for example. In such processes, a relatively low-impedance substrate is used, which results in the correspondingly low coil quality factors. If a high-impedance substrate is used instead, the losses decrease and the coil quality factor increases. However, a high-impedance substrate can have disadvantageous effects on-an entire series of transistor properties. If high-impedance substrates were used, a standard CMOS process would no longer be possible in any case, and so a different process control would be necessary. However, this is not desirable.

A further possibility for improving the coil quality factor is to remove the substrate material directly below the coil by means of a suitable etching process. A metal layer can then be applied between the coil planes and the substrate. By introducing slots, it is possible to prevent eddy currents, shielding with respect to the substrate being achieved at the same time. However, such a solution has the disadvantage that one metal plane fewer is available for coil turns. Moreover, only slight improvements in the coil quality factor can be achieved therewith.

A further disadvantage of the known coils resides in the relatively large area requirements. The coil geometry shown in FIG. 1 requires an area of 0.3*0.3 mm at an inductance of approximately 9 nHz. If a larger inductance is required, the area requirement rises proportionally.

European published patent application EP 0 725 407 describes a three-dimensional coil which is integrated in a microelectronic circuit and in which the coil axis lies horizontally with respect to the chip surface. The coil has one or more turns. The turns are produced by interconnects of a lower metalization plane and interconnects of an upper metalization plane and also via contacts connecting them. In general, "via" is understood to mean a connection piece between two metal planes. In the prior art solution, the inductance is achieved by means of a core made of material of high permeability, which core is introduced between the interconnects and via contacts and constitutes a fundamental feature of the prior art solution. In the case of the coil geometry disclosed in EP 0 725 407, only a small part of the magnetic field penetrates into the substrate, with the result that the losses associated with this decrease and, consequently, the quality factor of the coil is improved. Despite this advantage, that coil geometry has not been used to date. This is due, for example, to the fact that a semiconductor-compatible core material is not available at the present time. Moreover, at high frequencies, all materials of high permeability exhibit high magnetization-reversal losses, which in turn limit the coil quality factor. Furthermore, the via resistances are too high in the case of the metalization layers that are typically used.

SUMMARY OF THE INVENTION

It is accordingly an object of the invention to provide a coil and a coil system for integration into a microelectronic circuit, and also to provide a microelectronic circuit, which overcome the above-mentioned disadvantages of the heretofore-known devices and methods of this general type and wherein the coils, or coil systems, having a high quality factor can be produced in a simple and cost-effective manner and be integrated into microelectronic circuits.

With the foregoing and other objects in view there is provided, in accordance with the invention, a coil for integration into a microelectronic circuit on a chip, comprising:

interconnects formed in spatially separate metalization planes of the chip;

at least one turn formed by the interconnects, or at least segments of the interconnects, formed in the spatially separate metalization planes; and via contacts connecting the interconnects and each being formed from a stack of at least two via elements disposed one above the other.

In other words, the first above object is achieved, in accordance with the invention, by a coil for integration into a microelectronic circuit, having one or more turns, the turn(s) being formed by at least segments of two interconnects, which are formed in metalization planes that are in each case spatially separate from one another, and also the via contacts connecting said interconnect(s) and/or interconnect segments. According to the invention, the coil is formed from a stack of two or more via elements arranged one above the other.

This provides a coil having a high quality factor which can readily be integrated into microelectronic circuits. In terms of its basic construction, the coil according to the invention proceeds from the coil described in EP-A-0 725 407. Owing to the low punch-through of leakage fields into the substrate, high coil quality factors can be realized with such a coil geometry. The formula for the inductance in the case of such a coil geometry reads as follows:

$$L=\mu 0 * \mu r * A * N^2/1$$

In this case, $\mu 0$ is the permeability constant (1.2 $E^{-6}$ H/M) and $\mu r$ is the relative permeability (approximately 100,000 in the case of ferromagnetic material). A is the cross-sectional area of the coil perpendicular to the coil axis, N is the number of turns, and L is the length of the coil. For these reasons described in relation to the prior art, a magnetic core is dispensed with in the case of the coil according to the invention. Instead, it is a basic concept of the present invention that the cross-sectional area of the coil is enlarged. In the case of the solution described in EP-A-0 725 407, this would necessitate very long interconnects in order to realize areas of approximately 10–20 $\mu m^2$ given the thicknesses—customary in standard metalizations—of the via contacts (intermetal dielectrics) of 0.5 $\mu m$ to 0.3 $\mu m$. However, these long interconnects have a correspondingly high bulk resistance, as a result of which the quality factor of the coil is reduced. If a higher number of turns is chosen instead, then the bulk resistance likewise increases in accordance with the longer line length.

By virtue of the novel configuration of the via contacts in the form of stacks with in each case two or more via elements arranged one above the other, the cross section of the coil and thus the quality factor thereof can be increased and improved, respectively, in a simple manner. The effect that can be achieved by using a plurality of stacked via elements as via contact is that a standard metalization can be used for producing the coil. This means that a particularly thick intermetal dielectric with correspondingly deep via contacts does not have to be used for increasing the cross-sectional area. The production of particularly deep via contacts deviating from the standard metalizations would only be possible with the aid of special processes, with the result that the production of such coils would be structurally complicated and cost-intensive. A further advantage of the coil according to the invention is that relatively large coil cross-sectional areas can be achieved with short interconnects. Furthermore, it is possible to dispense with an additional magnetic core which constituted one of the basic prerequisites of the solution disclosed in the above-mentioned European document EP 0 725 407.

In modern silicon technologies, there are usually 4 to 6 metal planes available. This means that the vertical distance between the bottommost and the topmost metal layer (metalization plane) may amount to up to 4 $\mu m$. If, in a standard metalization, the connection between upper and lower metalization planes is realized not by a—particularly long—via contact, but rather by a stack of via elements lying one above the other, the height of the coil cross-section amounts to precisely said 4 $\mu m$. As has already been explained further above, the distance between two interconnects of the coil has been about 0.5 $\mu m$ to date in the case of known solutions.

In a concrete example, the coil according to the invention may have one or more turns, a turn in each case being formed by interconnect pieces, or interconnects, on a bottommost metalization plane and on a topmost metalization plane and also by the via contacts—serving as vertical connections—made of stacks of two or more via elements between said metalization planes.

The via contacts may advantageously be oriented at least essentially perpendicularly to the interconnects and/or interconnect segments.

Constituent parts of a metalization plane may preferably be provided at least between individual via elements of a stack.

Via contacts formed in this way make it possible to use a standard metalization for producing the coil. In this case, it has surprisingly been found that via contacts formed in this way have no disadvantages relative to thicker single-part via contacts that are otherwise necessary.

The interconnect(s) and/or the interconnect segments and also the via contacts preferably delimit the cross section of the coil. This cross-sectional area is determined by the vertical distance between the metalization planes forming the interconnect(s) or the interconnect segments, and also the respective length of the interconnect(s) or interconnect segments on said metalization planes. These lengths can be chosen freely within limits owing to the bulk resistance of the lines. Consequently, with longer line pieces on the corresponding metalization planes, correspondingly larger cross-sectional areas are possible.

The interconnect(s) and/or interconnect segments forming the turn or turns of the coil may advantageously be arranged at a distance of about 4 $\mu m$ from one another. As has already been mentioned further above, such a distance results for example when there are about 4 to 6 metalization planes available.

In accordance with a further refinement, the interconnect(s) and/or interconnect segments and/or the via elements and/or the constituent parts of a metalization plane that are provided between individual via elements may be formed from copper, in particular from copper deposited electrolytically. When copper is used, the constituent parts have only a low resistance. If copper is used as interconnect material, the resistance of the via contact formed as a stack from two or more via elements also remains low. This resistance may be, for example, 3 $\Omega$, in the case of a 0.18 $\mu m$ technology. By means of n-via stacks this resistance can be reduced to 1/n by means of connection in parallel. If a standard metalization with copper is used to produce the coil, it is also possible, for example, during this method, to fill the vertical connection pieces between the metal planes (the via elements) with the low-impedance copper.

In accordance with a particularly advantageous feature of the invention, copper deposited by means of an electrolytic method is used. This production of the copper is already known per se. It is described, for example in the paper "Copper Electroplating" by Alexander E. Braun, which was published in the journal "Semiconductor International", April 1999, page 58 et seq., and whose disclosure content is in this respect incorporated in the description of the present invention.

The coil may advantageously be formed for integration in a microelectronic circuit arranged on and/or in a substrate, the coil axis being oriented horizontally with respect to the substrate surface. This makes it possible to reduce the punch-through of leakage fields into the substrate, which leads to higher coil quality factors.

The coil start and the coil end of the coil may preferably be arranged adjacent to one another with the result that the coil axis forms an at least approximately closed line, in particular a circular line. Such a form of the coil axis reduces the leakage losses, which leads to a further improvement in the coil quality factor. Particularly when the coil axis forms an approximately circular line, this geometry allows the coil to be shielded laterally in a suitable manner, as will be explained in more detail as the description progresses with regard to the coil system according to the invention.

The second above object is achieved with a coil system for integration in a microelectronic circuit, which, according to the invention, is characterized by one or more coils according to the invention as described above. With regard to the advantages, actions, effects and the method of operation of the coil system according to the invention, reference is likewise made to the entire contents of the above explanations concerning the coil according to the invention, and they are hereby incorporated by reference.

Preferably, for the shielding of the coil(s), provision is made of a number of via stacks each formed from one or more via element(s). These via stacks are advantageously arranged outside the coil(s), in particular outside the coil periphery, around the latter. If a whole series of via stacks are arranged next to one another, placed around a coil, then efficient lateral shielding of the coil can thereby be achieved.

In accordance with an added feature of the invention, the via stacks are oriented approximately perpendicularly to the coil axis.

In accordance with a further refinement of the invention, there is provided at least one shielding plane for the vertical shielding of the coil.

By way of example, the shielding plane may be formed as a metal plane.

In a further refinement, the shielding plane may be formed as a polysilicon area or as a structure with a highly doped substrate.

If there are sufficient metalization planes available, then the topmost metalization plane may be used, for example, as a shielding plane for vertical shielding of the coil toward the top. This metal plane may preferably be formed as a slotted area in order to prevent eddy currents. For shielding of the coil toward the bottom, use may be made, for example, of a shielding plane which is formed as a polysilicon layer or a structure with a highly doped substrate. This lower shielding plane may also advantageously be formed as a slotted area.

The invention, furthermore, provides for a microelectronic circuit, having a number of integrated components, at least one of these components being formed as an inductance. According to the invention, the microelectronic circuit is characterized by the fact that the component provided as an inductance is formed as a coil according to the invention as described above and/or as a coil system according to the invention as described above. This makes it possible to create microelectronic circuits in which coils, or coil systems, having a high quality factor can be integrated, so that such microelectronic circuits can also be used at very high frequencies in ranges far above 1 GHz. With regard to the advantages, actions, effects and the method of operation of the microelectronic circuit according to the invention, reference is likewise made to the entire contents of the above explanations concerning the coil according to the invention, and also the coil system according to the invention, and they are hereby incorporated by reference.

The microelectronic circuit may advantageously be formed on and/or in a chip, the chip being formed from a substrate and at least one oxide layer.

The coil, for example the coil system, may preferably be arranged within the oxide layer. In this way, it is possible to resort to a standard metalization during the production of the coil.

Other features which are considered as characteristic for the invention are set forth in the appended claims.

Although the invention is illustrated and described herein as embodied in a coil and coil system for integration into a micro-electronic circuit and microelectronic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 4 is a further view of the coil according to the invention as shown in FIG. 2;

FIG. 5 is a diagrammatic cross-sectional view of the coil according to the invention as shown in FIG. 4, in which the profile of the magnetic field lines is illustrated;

FIG. 10 shows a cross-sectional view of the coil system according to the invention taken along the section line X—X shown in FIG. 9.

DESCRIPTION OF THE PREFERRED EMBODIMENTS

Figure 1:
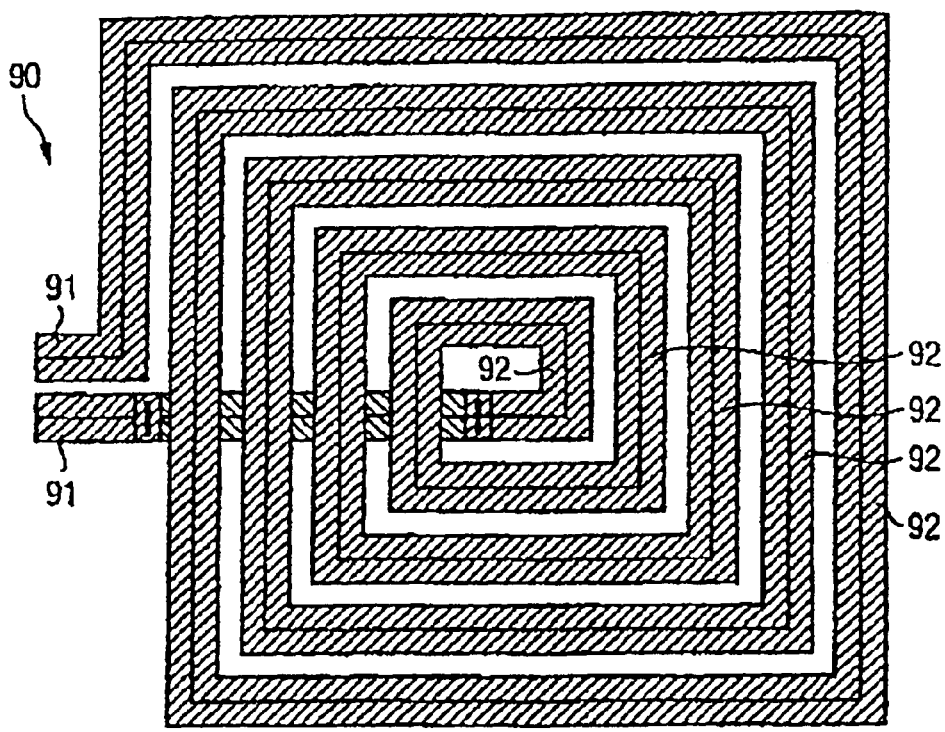
FIG. 1 is a diagrammatic plan view onto a prior art coil configuration.

As noted in the introductory text, FIG. 1 illustrates a coil 90 as it is known from the prior art. The coil 90 has a metal track 91 that runs through a spiral, thereby producing a number of turns 92 with increasing radii. If a plurality of metal layers are available, the coils 90 formed in this way can be stacked one above the other and subsequently be connected either in series or in parallel. The disadvantageous features of such coils 90 are mentioned in the introductory description.

Figure 2:
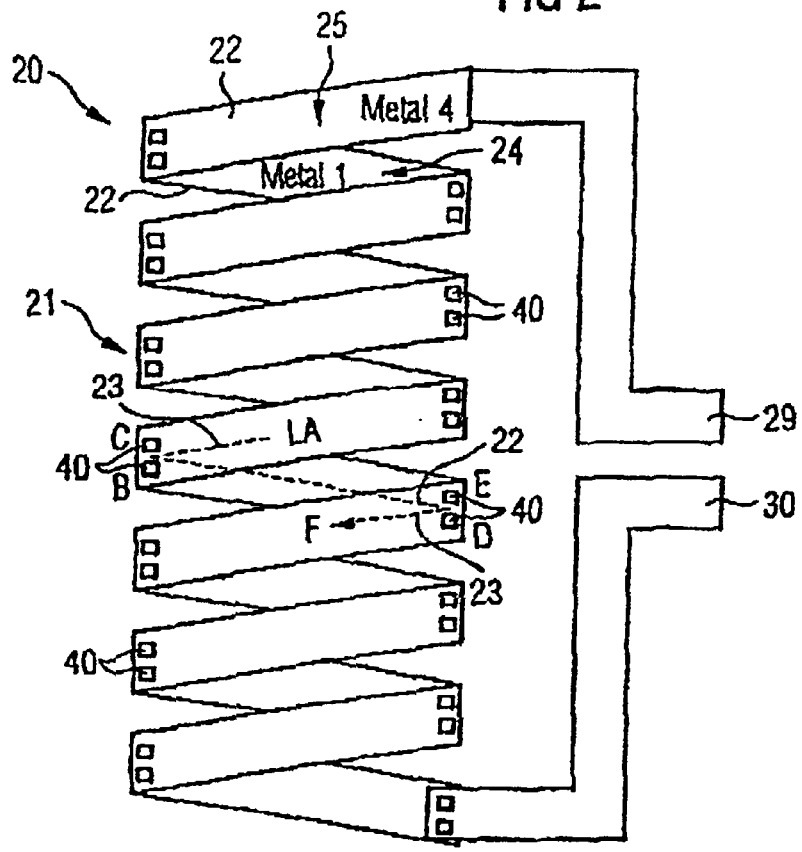
FIG. 2 is a diagrammatic view of a first structural embodiment of a coil according to the present invention.
Figure 3:
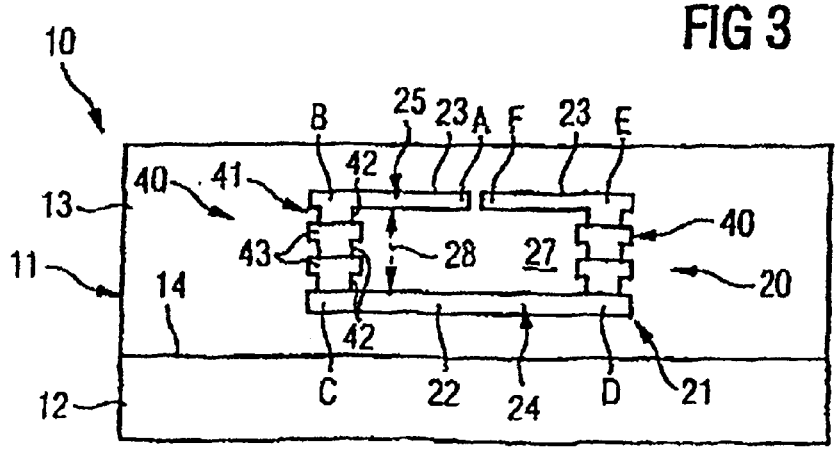
FIG. 3 is a diagrammatic cross-sectional view of the coil according to the invention as shown in FIG. 2, the coil being integrated in a microelectronic circuit.

Referring now to the figures of the drawing in detail that illustrate the inventive concept, and first, particularly, to FIGS. 2 and 3 thereof, there is shown a first embodiment of a coil 20 according to the invention for integration in a microelectronic circuit 10. As revealed by FIG. 3, in particular, the microelectronic circuit 10 is formed in a chip 11 which is in turn formed from a substrate 12 and at least one oxide layer 13. The oxide layer 13 is formed on the substrate surface 14 in the present exemplary embodiment.

The coil 20 has a coil start 29 and a coil end 30 and also a number of turns 21. Each coil turn 21 is formed by interconnects 22 or interconnect segments 23. The interconnects 22, or the interconnect segments 23, are formed by a lower metalization plane 24 and also an upper metalization plane 25. In order to connect the two metalization planes 24, 25, or the interconnects 22 or interconnect segments 23, provision is made of vertical connection pieces between the metalization planes 24, 25 which are referred to as via contacts 40. All the constituent parts of the turn(s) 21 are composed of copper and therefore have only a low resistance. The coil cross-sectional area 27 enclosed by the turn 21 is determined by the vertical distance 28 between the upper metalization plane 25 and the lower metalization plane 24. This distance amounts to approximately 4 µm in the present exemplary embodiment. Furthermore, the coil cross-sectional area 27 is determined by the length of the interconnects 22, or interconnect segments 23, on the lower and upper metalization planes 24, 25. These lengths can be chosen freely within limits owing to the bulk resistance of the lines. This means that, with longer line pieces on the lower and upper metalization planes 24, 25, correspondingly large cross-sectional areas are possible.

In order to be able to produce the coil 20 by means of a standard metalization without requiring particularly deep via contacts, which could only be produced by means of a complex and expensive special process, the via contacts 40 have a stack 41 made of in each case two or more via elements 42. Situated between the individual via elements 42 are constituent parts 43 of different metalization planes which are formed between the lower and upper metalization planes 24, 25. If copper is used as interconnect material, which can be deposited by an electrolytic method, then the resistance of this stack 41 of via elements 42 lying one above the other with constituent parts 43 of metalization planes situated between them nevertheless remains low.

As is revealed, moreover, by FIGS. 4 and 5, the coil axis 26 of the coil 20 is formed horizontally with respect to the substrate surface 14. This results in only low punch-through of magnetic leakage fields into the substrate 12. This is illustrated by the profile of the magnetic field lines 60 which is illustrated in FIG. 5.

On account of the large coil cross-section 27 that can be produced by means of a standard metalization, it is possible to dispense with a magnetic coil as described in EP-A-0 725 407.

Figure 6:
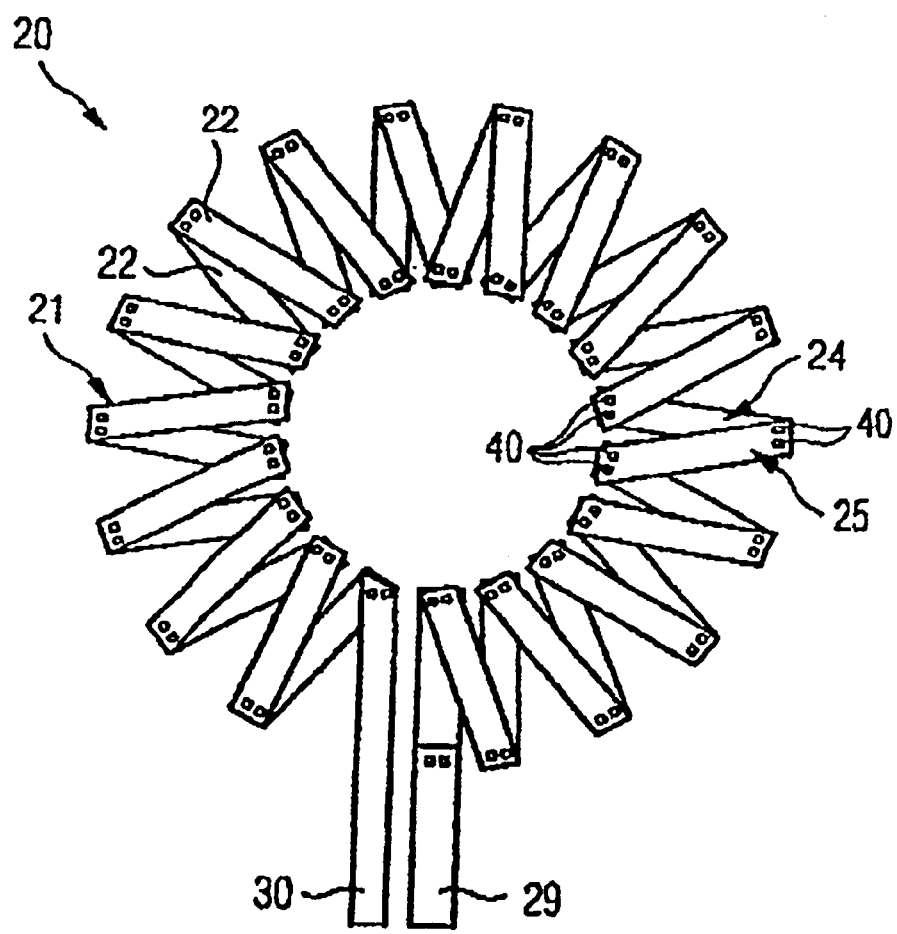
FIG. 6 is a further embodiment of a coil according to the present invention.

FIG. 6 illustrates a further embodiment of a coil 20 according to the invention. In the case of this coil 20, the coil axis 26 has an at least approximately closed, circular line. As a result, the entire coil 20 also acquires an approximately circular appearance. What is achieved by this coil configuration is that, besides the coil axis 26 formed as a closed line, the coil start 29 and the coil end 30 also lie directly adjacent to one another. Such a configuration of the coil 20 can improve the coil quality factor further, since the leakage component is reduced. The basic construction of the coil 20 in accordance with FIG. 6 approximately corresponds to that of the coil 20 illustrated in FIGS. 2 to 5, so that identical components are designated by identical reference numerals and, in order to avoid repetition, reference is made to the explanations concerning this exemplary embodiment.

Figure 7:
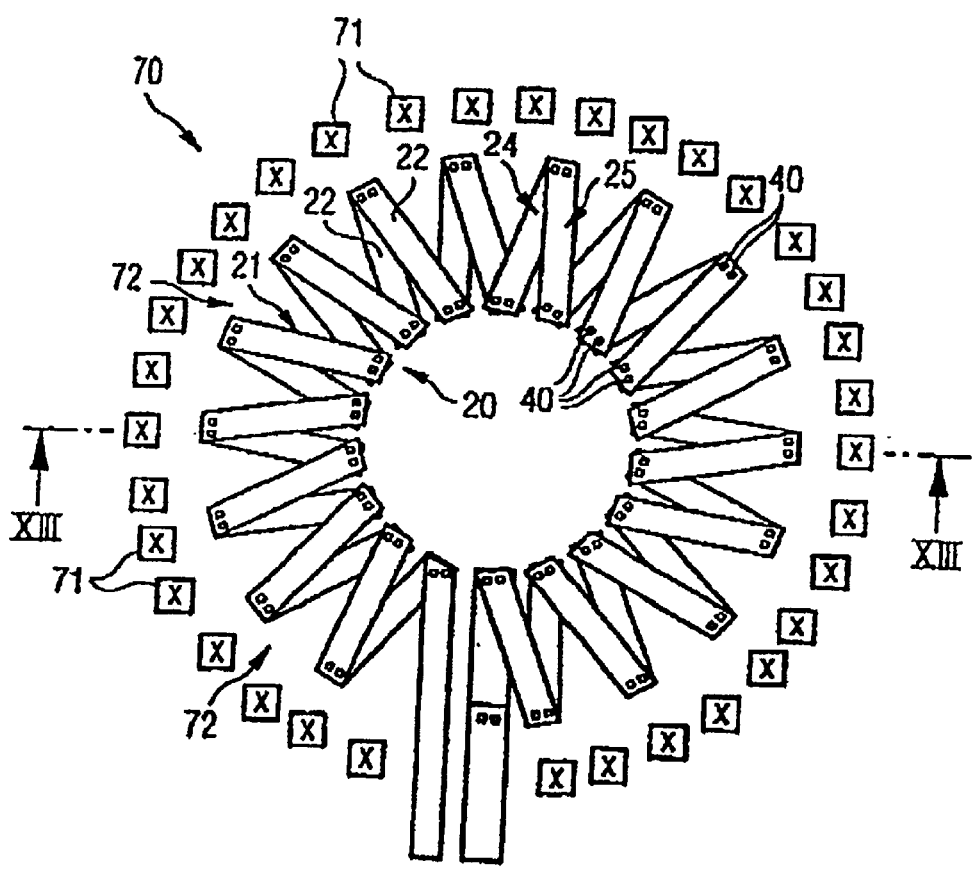
FIG. 7 is a diagrammatic plan view of a coil system according to the invention using a coil according to FIG. 6.
Figure 8:
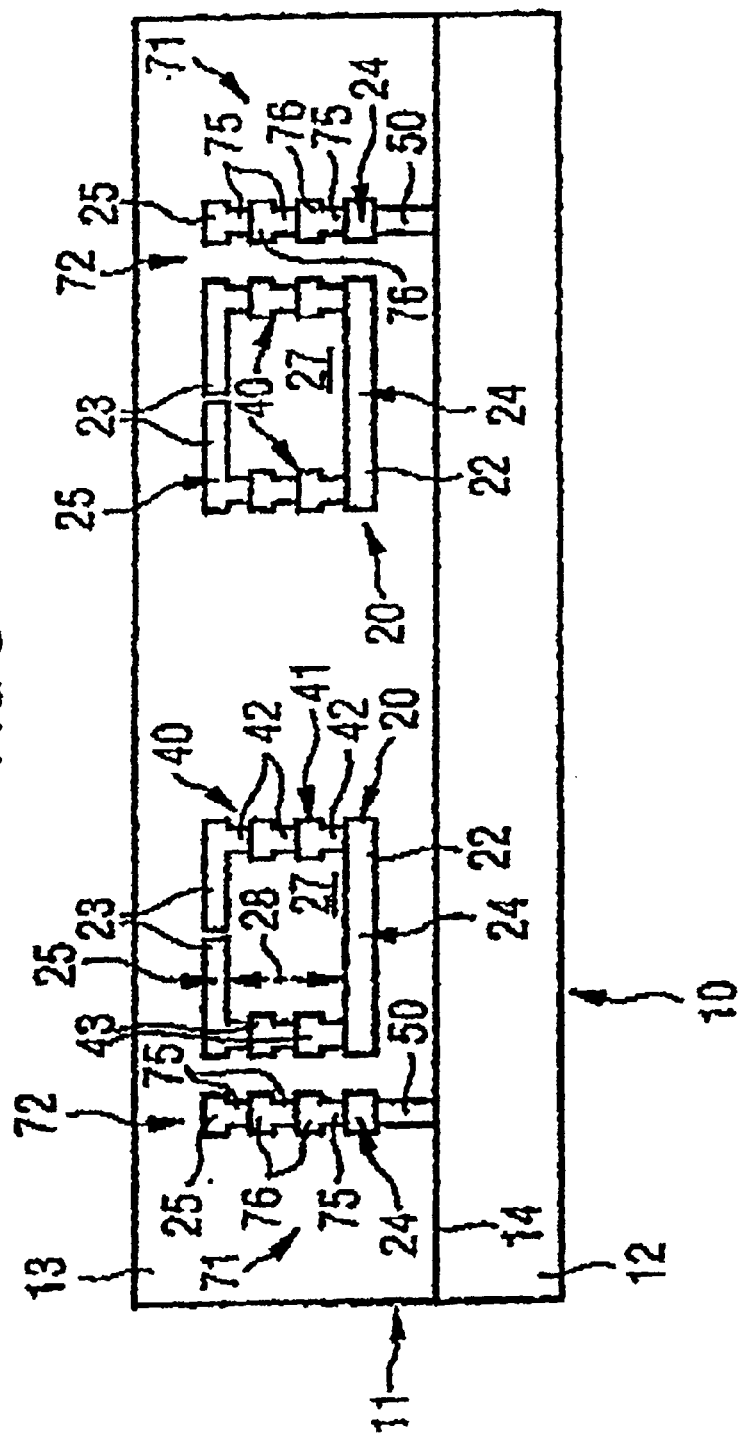
FIG. 8 is a cross-sectional view of the coil system according to the invention taken along the section line VIII—VIII shown in FIG. 7.

FIGS. 7 and 8 then illustrate a coil system 70 in which one or more coils 20 in accordance with FIG. 6 are used. Only a single coil 20 is illustrated for the sake of better clarity. The coil 20 is again a constituent part of a microelectronic circuit 10 and arranged within an oxide layer 13 of a chip 11, the oxide layer 13 being situated on the substrate surface 14 of a substrate 12.

In order to be able to realize efficient lateral shielding of the coil 20, provision is made of a series of via stacks 71 which are arranged next to one another in the region outside the coil periphery 72 and are placed around the coil 20. The via stacks 71 extend parallel to the via contacts 40.

In a similar manner to the via contacts 40, the via stacks 71 comprise two or more via elements 75 between which constituent parts 76 of metalization planes are situated. As in the case of the coil 20, the bottommost metalization plane is the metalization plane 24, while the topmost metalization plane is the metalization plane 25, as in the case of the coil 20. Consequently, the standard metalization, preferably standard metalization with copper, can also be used for the production of the via stack 71. The via stacks 71 can be produced at the same time as the coil 20.

In contrast to the via contacts 40 and the coil 20, the via stacks 71 are connected to the substrate 12 by corresponding contacts 50.

Figure 9:
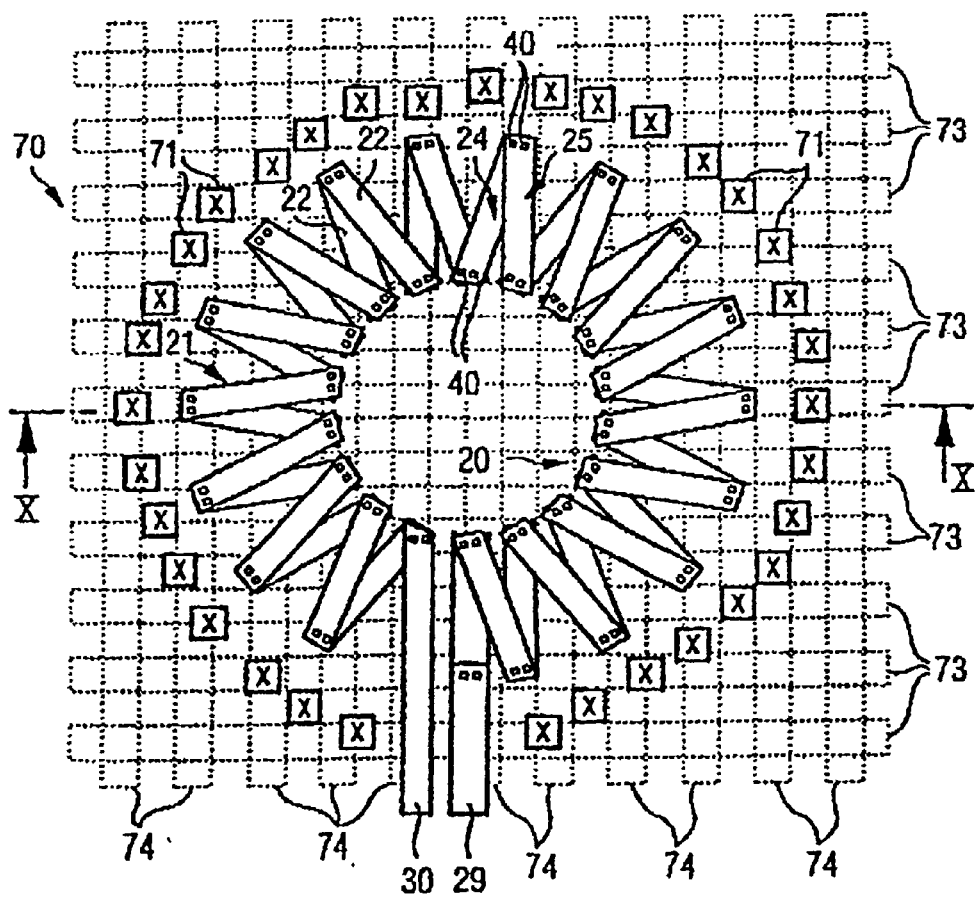
FIG. 9 is a diagrammatic view of a further embodiment of a coil system according to the invention using a coil illustrated in FIG. 6.

Finally, FIGS. 9 and 10 illustrate a modified embodiment of a coil system 70 which leads further with regard to FIGS. 7 and 8. In this case, in comparison with FIGS. 7 and 8, identical components have again been designated by identical reference numerals.

In addition to the coil system 70 illustrated in FIGS. 7 and 8, the coil system 70 in accordance with FIGS. 9 and 10 has an upper shielding plane 73 and also a lower shielding plane 74. If sufficient metalization planes are available in the case of the microelectronic circuit 10 illustrated in FIG. 10, the topmost metalization plane, the shielding plane 73 in the present case, can be used for the vertical shielding of the coil 20 toward the top. In the present exemplary embodiment, the upper shielding plane 73 is composed of metal. In order to prevent eddy currents, the upper shielding plane 73 is formed as a slotted area.

For the shielding of the coil 20 toward the bottom, it is possible to use the lower shielding plane 74, which may be formed, for example, as a polysilicon layer or a structure with a highly doped substrate. In the same way as the upper shielding plane 73, the lower shielding plane 74 may also be formed as a slotted area.

We claim:

1. A coil for integration into a microelectronic circuit on a chip, comprising:
   interconnects formed in spatially separate metalization planes of the chip;
   at least one turn formed by said interconnects formed in the spatially separate metalization planes and via contacts connecting said interconnects, each via contact being formed from a stack of at least two via elements disposed one above the other.

2. The coil according to claim 1, wherein said interconnects are formed in segments and said at least one turn is formed by said segments of said interconnects.

3. The coil according to claim 2, wherein the coil has a defined cross section delimited by said segments of said interconnects and said via contacts.

4. The coil according to claim 2, wherein at least one component selected from the group consisting of said interconnects, said interconnect segments, and said via elements is formed of copper.

5. The coil according to claim 4, wherein said copper is electrolytically deposited copper.

6. The coil according to claim 1, wherein constituent parts of a metalization plane are disposed at least between individual said via elements of a respective stack.

7. The coil according to claim 6, wherein at least one component selected from the group consisting of said interconnects, said interconnect segments, and said via elements, and said constituent parts of the metalization plane between individual via elements is formed of copper.

8. The coil according to claim 7, wherein said copper is electrolytically deposited copper.

9. The coil according to claim 1, wherein at least one component selected from the group consisting of said interconnects and said via elements is formed of copper.

10. The coil according to claim 9, wherein said copper is electrolytically deposited copper.

11. The coil according to claim 1, wherein said via contacts extend substantially perpendicular to said interconnects.

12. The coil according to claim 1, wherein the coil has a defined cross section delimited by said interconnects and said via contacts.

13. The coil according to claim 1, wherein said interconnects forming said at least one turn are disposed at a spacing distance of approximately 4 µm from one another.

14. The coil according to claim 1 configured for integration in a microelectronic circuit disposed on and/or in a substrate, wherein a coil axis is oriented horizontally with respect to the substrate surface.

15. The coil according to claim 1, wherein said turns define a coil start and a coil end of the coil and said coil start and said coil end are disposed adjacent one another, such that a coil axis forms an at least approximately closed line.

16. The coil according to claim 15, wherein the coil axis forms a substantially circular line.

17. A coil system for a micro-electronic circuit, comprising at least one coil according to claim 1 integrated in the micro-electronic circuit.

18. The coil system according to claim 17, which comprises a plurality of via stacks for shielding the at least one coil each formed of a number of via stacks each formed from at least two via elements, and wherein said via stacks are disposed outside the at least one coil.

19. The coil system according to claim 18, wherein said via stacks are formed outside a coil periphery, around said coil.

20. The coil system according to claim 18, wherein said via stacks are oriented approximately perpendicularly to a coil axis.

21. A microelectronic circuit, comprising a number of integrated components, said integrated components including an inductance formed as a coil system according to claim 17.

22. The microelectronic circuit according to claim 21, wherein said integrated components and said coil system are integrated in a chip, and said chip is formed from a substrate and at least one oxide layer.

23. The microelectronic circuit according to claim 22, wherein said coil system is arranged within said oxide layer.

24. The coil system according to claim 17, which comprises at least one shielding plane for vertically shielding the coil.

25. The coil system according to claim 24, wherein said shielding plane is a metal plane.

26. The coil system according to claim 24, wherein said shielding plane is a polysilicon plane.

27. The coil system according to claim 24, wherein said shielding plane is a structure with a highly doped substrate.

28. A microelectronic circuit, comprising a number of integrated components, said integrated components including an inductance formed as a coil according to claim 1.

29. The microelectronic circuit according to claim 28, wherein said integrated components and said coil are integrated in a chip, and said chip is formed from a substrate and at least one oxide layer.

30. The microelectronic circuit according to claim 29, wherein said coil is arranged within said oxide layer.

* * * * *